US010714251B2

(12) United States Patent
Dolgin et al.

(10) Patent No.: US 10,714,251 B2
(45) Date of Patent: Jul. 14, 2020

(54) PRECISION TRANSFORMER FOR ANTENNA ELEMENTS

(71) Applicant: RAYTHEON COMPANY, Waltham, MA (US)

(72) Inventors: Benjamin P. Dolgin, Alexandria, VA (US); Thomas Lavedas, Moneta, VA (US); Joseph J. Fraundorfer, Portsmouth, RI (US)

(73) Assignee: RAYTHEON COMPANY, Waltham, MA (US)

( * ) Notice: Subject to any disclaimer, the term of this patent is extended or adjusted under 35 U.S.C. 154(b) by 148 days.

(21) Appl. No.: 15/963,519

(22) Filed: Apr. 26, 2018

(65) Prior Publication Data

US 2018/0315539 A1 Nov. 1, 2018

Related U.S. Application Data

(60) Provisional application No. 62/490,369, filed on Apr. 26, 2017.

(51) Int. Cl.
| | |
|---|---|
| H01F 27/24 | (2006.01) |
| H01F 27/28 | (2006.01) |
| H03H 7/42 | (2006.01) |
| H01Q 1/50 | (2006.01) |
| H01F 19/00 | (2006.01) |
| H01F 27/38 | (2006.01) |
| H01F 27/34 | (2006.01) |
| H01F 38/00 | (2006.01) |

(52) U.S. Cl.
CPC ............. *H01F 27/24* (2013.01); *H01F 19/00* (2013.01); *H01F 27/28* (2013.01); *H01F 27/2895* (2013.01); *H01F 27/346* (2013.01); *H01F 27/38* (2013.01); *H01Q 1/50* (2013.01); *H03H 7/42* (2013.01); *H01F 2038/006* (2013.01)

(58) Field of Classification Search
CPC ... H01P 5/10; H03H 7/42; H01F 27/24; H01F 27/27; H01F 27/28
USPC .......................................................... 333/26
See application file for complete search history.

(56) References Cited

U.S. PATENT DOCUMENTS

| 3,195,076 A * | 7/1965 | Morrison ................. H03H 7/42 333/26 |
| 3,244,998 A * | 4/1966 | Broadhead, Jr. .......... H03F 3/60 330/306 |
| 5,808,518 A * | 9/1998 | McKinzie, III ........... H01P 5/10 29/600 |
| 6,337,608 B1 * | 1/2002 | McLean .................... H01P 5/02 333/26 |

(Continued)

Primary Examiner — Dean O Takaoka
(74) Attorney, Agent, or Firm — Lando & Anastasi, LLP

(57) ABSTRACT

Antenna structures including two anti-symmetrically wound transformers to compensate for stray radiation. In one example an antenna structure includes a transformer assembly connected between an antenna and first and second balanced signal contacts, the transformer assembly including first and second transformer cores independently positionable in space relative to one another, a pair of primary windings connected to the antenna in parallel with one another, and a pair of balanced secondary windings connected in parallel with one another between the first and second balanced signal contacts.

13 Claims, 4 Drawing Sheets

(56) References Cited

U.S. PATENT DOCUMENTS

| | | | |
|---|---|---|---|
| 7,573,349 B2 * | 8/2009 | Rauch | H01P 5/10 333/26 |
| 8,026,775 B2 * | 9/2011 | Meharry | H03F 3/602 333/119 |
| 8,456,267 B2 * | 6/2013 | Schoessow | H01F 19/08 333/24 R |
| 9,390,848 B2 * | 7/2016 | Ouyang | H02M 1/10 |

* cited by examiner

PRECISION TRANSFORMER FOR ANTENNA ELEMENTS

CROSS-REFERENCE TO RELATED APPLICATIONS

This application claims the benefit under 35 U.S.C. § 119(e) of U.S. Provisional Application No. 62/490,369 filed on Apr. 26, 2017 and titled "PRECISION TRANSFORMER FOR ANTENNA ELEMENTS," which is herein incorporated by reference in its entirety for all purposes.

FEDERALLY SPONSORED RESEARCH

This invention was made with government support under Contract No. W911QY-17-C-0003 awarded by the Department of Defense. The U.S. government has certain rights in this invention.

BACKGROUND

Transformers are often used as part of antenna structures. FIG. 1A is a diagram illustrating an example of a conventional antenna sub-system 100 including a transformer 110 connected to an antenna 120.

A common type of transformer used in antenna structures is the BALUN transformer. An example of a BALUN transformer 110 connected to the antenna 120 is shown in FIG. 1B. The transformer includes two electrically separate windings 112, 114 that generally are made of wire coils wound around the transformer's core. The transformer 110 converts between a balanced signal (two signals received at the electrical contacts 116a and 116b and referenced against one another) on the winding 114 and an unbalanced signal (one signal referenced against a ground 130) on the other winding 112. The goal of the BALUN transformer is to balance different elements of the antenna 120 relative to ground 130 to suppress reception of common mode interference, and to improve antenna directionality and similar properties. Unfortunately, however, the transformer itself can become a source of unwanted interference, particularly in precisely balanced antennas. Stray radiation (denoted by vector B in FIGS. 1A and 1B) may induce electromagnetic interference in the transformer windings 112, and/or 114 due to asymmetry of the coil layout and field gradients. The phenomenon is present even in transformers with toroidal cores, which are inherently self-shielding.

Conventional approaches to addressing this problem have centered on producing transformers with highly symmetric windings, using fully enclosed cores (e.g., a mushroom core), and improved shielding.

SUMMARY OF THE INVENTION

Aspects and embodiments are directed to the use of two anti-symmetrically wound transformers to compensate for stray radiation.

According to one embodiment, a transformer assembly comprises a first toroidal core transformer having a first core and a first primary winding and a first secondary winding each wound around the first core, and a second toroidal core transformer having a second core and a second primary winding and a second secondary winding each would around the second core, the second core being twisted 180 degrees relative to the first core along an axis in plane of the second core, the first and second primary windings being connected in parallel with one another, the first and second secondary windings being connected in parallel with one another, a first half of the first secondary winding being connected in series with a second half of the second secondary winding, and a second half of the first secondary winding being connected in series with a first half of the second secondary winding.

In one example the first and second cores are made of a ferro-magnetic material. In another example the first and second toroidal core transformers are substantially identical. In another example the first and second transformers are anti-symmetrically wound relative to one another.

Another embodiment is directed to an antenna sub-system comprising an antenna, first and second balanced signal contacts, and a transformer assembly connected between the antenna and the first and second balanced signal contacts. The transformer assembly includes first and second transformer cores independently positionable in space relative to one another, a pair of primary windings connected to the antenna in parallel with one another, and a pair of balanced secondary windings connected in parallel with one another between the first and second balanced signal contacts.

In one example of the antenna sub-system the transformer assembly includes a first transformer having the first transformer core, a first primary winding of the pair of primary windings, and a first secondary winding of the pair of secondary windings, the first primary winding and the first secondary winding being wound around the first transformer core, and a second transformer having the second transformer core, a second primary winding of the pair of primary windings, and a second secondary winding of the pair of secondary windings, the second primary winding and the second secondary winding being wound around the second transformer core. In one example the first and second transformers are toroidal core transformers. In another example a first half of the first secondary winding is connected in series with a second half of the second secondary winding between the first and second signal contacts, and wherein a second half of the first secondary winding is connected in series with a first half of the second secondary winding between the first and second signal contacts. In one example the second transformer core is twisted 180 degrees relative to the first transformer core along an axis in plane of the second transformer core. In another example each of the first transformer core and the second transformer core is made of a ferro-magnetic material. The first and second transformers may be substantially identical.

According to another embodiment an antenna sub-system comprises an antenna, first and second balanced signal contacts, and a transformer assembly connected between the antenna and the first and second balanced signal contacts. The transformer assembly includes first and second substantially identical and anti-symmetrically wound transformers connected in parallel between the antenna and the first and second balanced signal contacts.

In one example of the antenna sub-system the first transformer includes a first primary winding connected to the antenna and a first secondary winding connected between the first and second signal contacts, and the second transformer includes a second primary winding connected to the antenna in parallel with the first primary winding, and a second secondary winding connected in parallel with the first secondary winding between the first and second signal contacts. In another example a first half of the first secondary winding is connected in series with a second half of the second secondary winding between the first and second signal contacts, and wherein a second half of the first secondary winding is connected in series with a first half of the second secondary winding between the first and second signal contacts. In another example the first and second transformers are toroidal core transformers.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Aspects and embodiments are directed to the use of two anti-symmetrically wound transformers to compensate for stray radiation in antenna structures.

Figure 1A:
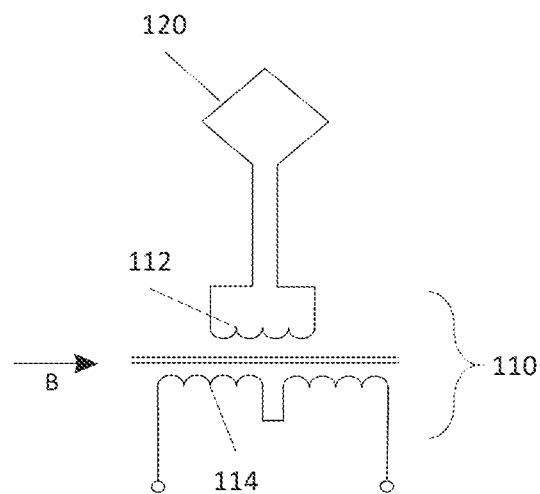
FIG. 1A is a schematic diagram of one example of a conventional antenna structure including a transformer connected to an antenna element.
Figure 1B:
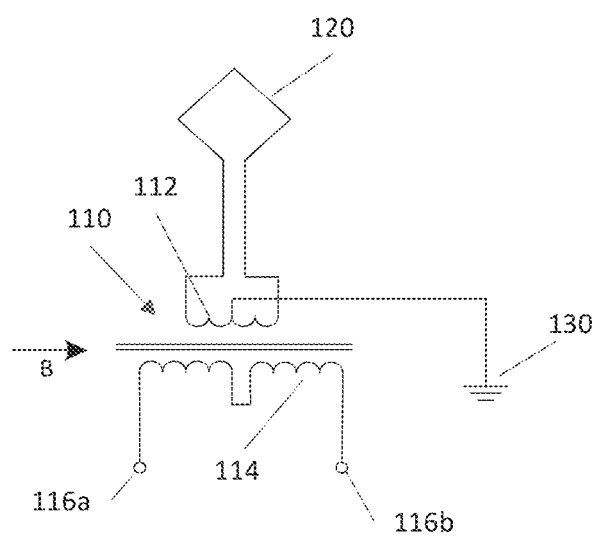
FIG. 1B is a schematic diagram of one example of a conventional BALUN transformer connected to an antenna element.
Figure 2:
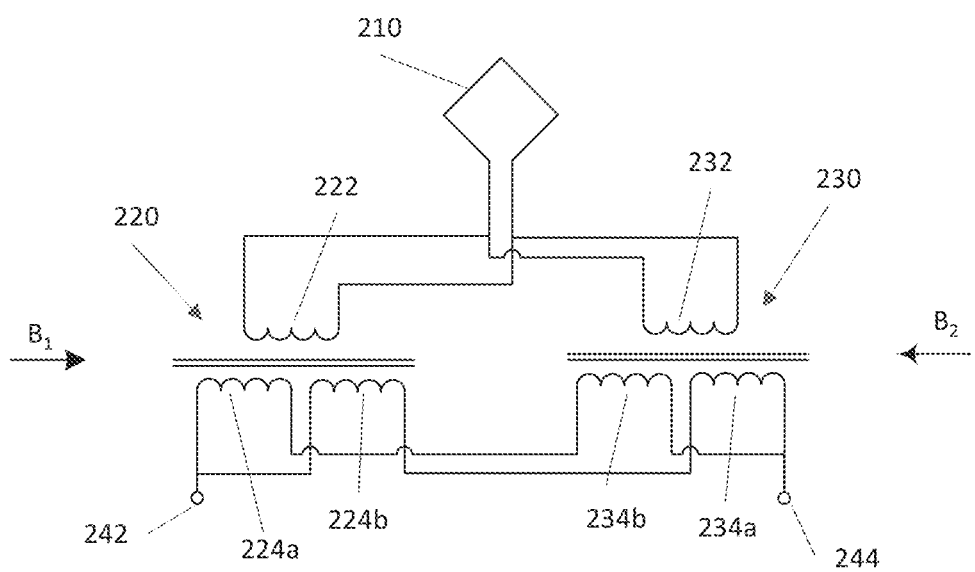
FIG. 2 is a schematic diagram of one example of an antenna structure including two anti-symmetrically wound transformers according to aspects of the present invention.

Referring to FIG. 2, there is illustrated an example of an antenna sub-system according to certain embodiments. In this example, the antenna sub-system 200 includes an antenna 210 connected to a transformer assembly including two identical (or substantially identical, meaning as identical as feasible) transformers 220, 230. Each transformer 220, 230, includes two electrically separate windings that generally are made of wire coils wound around the transformer's core. The core may be made of a magnetic or ferro-magnetic material, for example, such as laminated iron, iron powder, or ferrite. In one example, the two transformers 220, 230 are toroidal core transformers. Toroidal core transformers may be advantageous in that a toroidal transformer may be more compact than transformers with other shaped cores, and because the toroid is a closed-loop core it may have a higher magnetic field and thus higher inductance and Q factor than an inductor of the same value with a straight core (solenoid coil). In addition, an advantage of the toroidal shape is that, due to its symmetry, the amount of magnetic flux that escapes outside the core (leakage flux) is low, therefore a toroidal transformer may be more efficient and radiate less electromagnetic interference than transformers with other shaped cores. Conversely, when the transformer is used in the small signal circuit, the external magnetic fields are coupling very weakly into the core and inject very little interference signal.

The two transformers 220, 230 are connected in parallel to the antenna 210, as shown in FIG. 2. However, one of the cores is twisted 180 degrees along an axis in plane of the core relative to the core of the other transformer. Thus, the orientation of the external magnetic field with respect to the second transformer core (vector B2 for the second transformer 230) is pointed in the opposite direction relative to the external magnetic field orientation with respect to the first transformer core (vector B1 for the first transformer 220), as shown in FIG. 2. On the unbalanced signal side, a first winding 222 of the first transformer 220 is connected to the antenna 210 in parallel with a first winding 232 of the second transformers 230, respectively. On the balanced signal side, second windings of both transformers 220, 230 are split in half. The first half 224a of the second winding of the first transformer 220 is connected in series with the second half 234b of the second winding of the second transformer 230 between first and second signal contacts 242, 244. Similarly, the second half 224b of the second winding of the first transformer 220 is connected in series with the first half 234a of the second winding of the second transformer 230 between the first signal contact 242 and the second signal contact 244, as shown in FIG. 2. The two series pairs of winding halves (224a, 234b, and 224b, 234a) are connected in parallel with one another between the first and second signal contacts 242, 244. This arrangement eliminates the coupling of stray radiation into the output signal of the transformer assembly, thus greatly reducing the influence of this stray radiation. In addition, the interference suppression inherent in the antenna 210 (e.g., generally in a range of about 40-60 dB) with which the transformer assembly is used is not degraded.

Figure 3A:
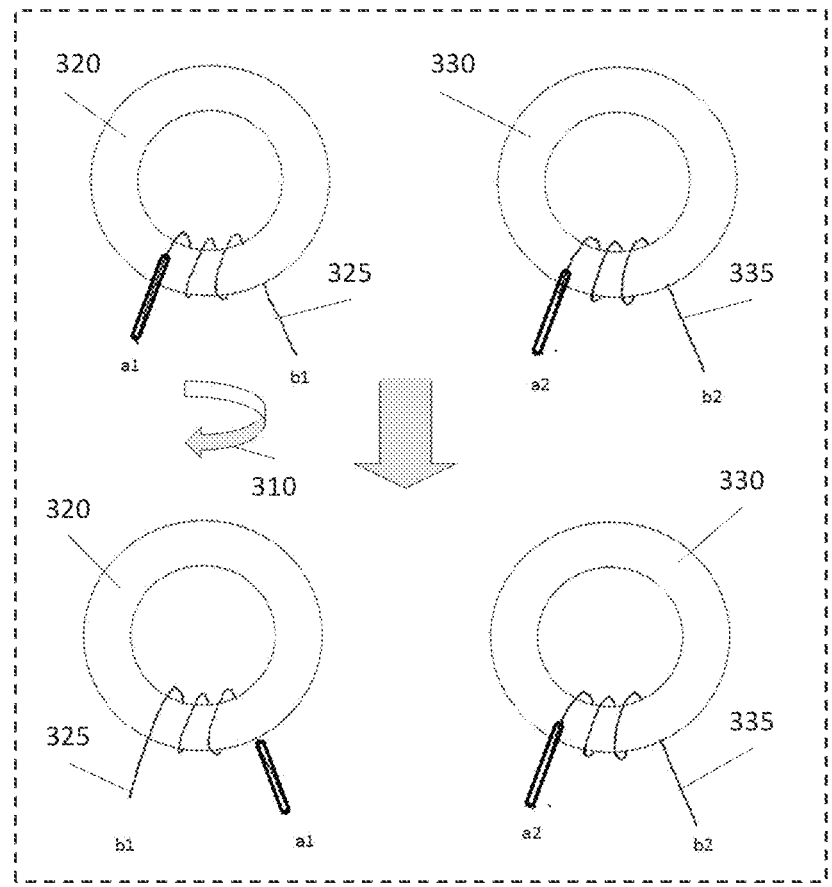
FIG. 3A is a diagram showing an example of one transformer core being twisted 180 degrees relative to a second transformer core about a first axis of rotation, according to aspects of the present invention.
Figure 3B:
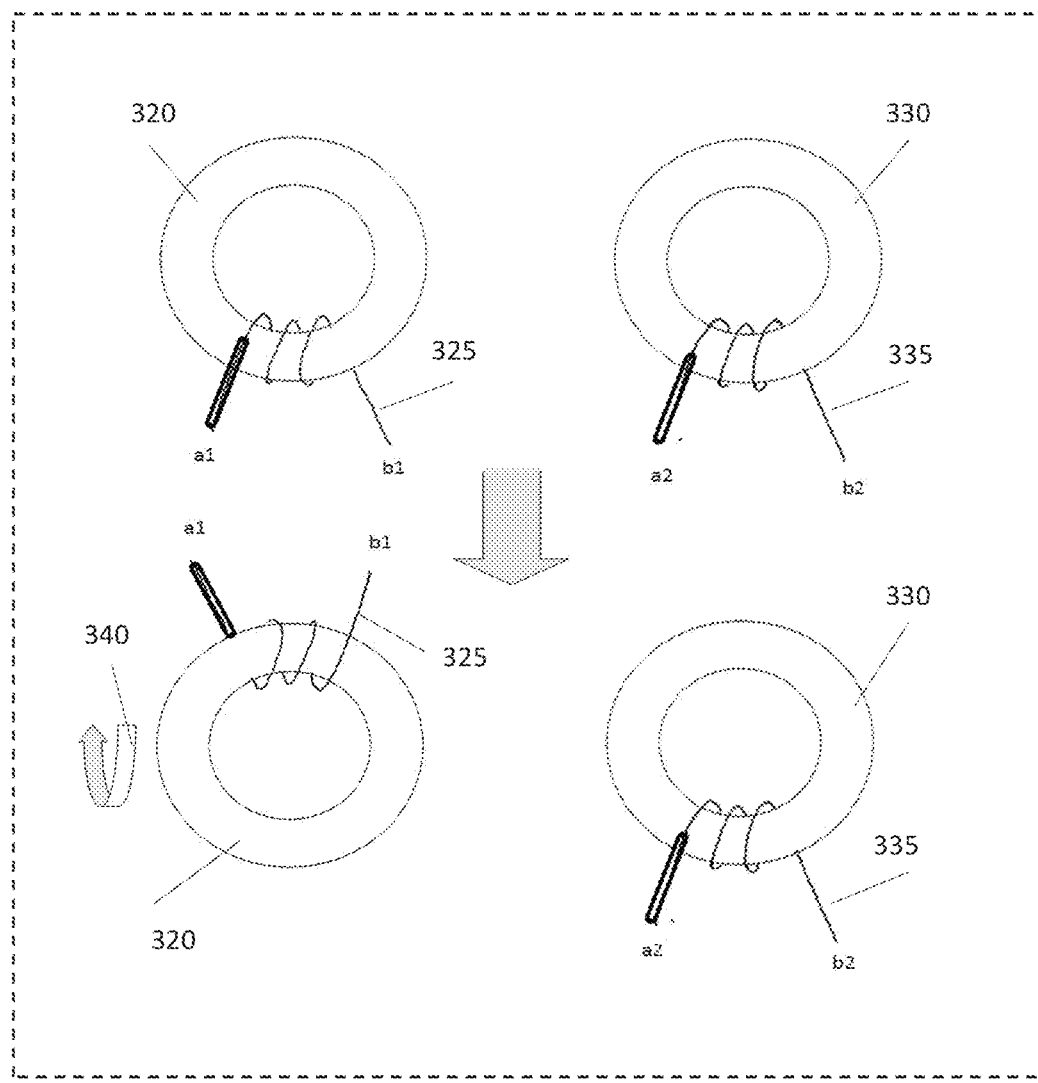
FIG. 3B is a diagram showing an example of one transformer core being twisted 180 degrees relative to a second transformer core about another axis of rotation, according to aspects of the present invention.

FIGS. 3A and 3B illustrate examples of one transformer core being twisted 180 degrees relative to the other. In the upper portion of each of FIG. 3A and FIG. 3B, first transformer core 320 of the first transformer 220 is shown having the same orientation as second transformer core 330 of the second transformer 230. For simplicity, only one coil or winding for each transformer is shown (winding 325 on the first transformer core 320 and winding 335 on the second transformer core 330). The lower portion of FIG. 3A shows the first transformer core twisted 180 degrees, as indicated by arrow 310. Similarly, the lower portion of FIG. 3B shows the first transformer core 320 twisted 180 degrees, but about a different axis than in FIG. 3A, as indicated by arrow 340. Point a1 on winding 325 is electrically connected to point a2 on winding 335 and, correspondingly, point b1 on winding 325 is electrically connected to point b2 on winding 335. Thus, the windings 325, 335 of two transformers 220, 230 are connected in parallel, as discussed above.

Aspects and embodiments provide a coupling transformer assembly that can be used for ultra-low noise applications and/or with highly directional antennas, where it may be desirable to suppress electromagnetic interference as much as possible. Embodiments of the transformer assembly may also be used for low noise applications in high noise environments, for example. As discussed above, according to certain embodiments, the transformer assembly includes two cores that can be positioned independently in space. In particular, one core may be twisted 180 degrees along an axis in plane of the core relative to the other core. Further, in certain embodiments, the transformer assembly can include two primary (or antenna-side) windings connected in parallel with one another to the antenna, along with two secondary windings that are also connected in parallel with one another between balanced signal contacts. As discussed above, in certain examples the secondary coils/windings of the two transformers making up the transformer assembly are balanced with respect to each other.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Embodiments disclosed herein may be combined with other embodiments in any manner consistent with at least one of the principles disclosed herein, and references to "an embodiment," "some embodiments," "an alternate embodiment," "certain embodiments," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment. Further examples and embodiments disclosed herein are not limited in application to the details of construction and the arrangement of components set forth in the foregoing description or illustrated in the accompanying drawings. Various examples are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Accordingly, the foregoing description and drawings are by way of example only, and the scope of the invention should be determined from proper construction of the appended claims and their equivalents.

What is claimed is:

1. A transformer assembly comprising:
   a first toroidal core transformer having a first core and a first primary winding and a first secondary winding each wound around the first core; and
   a second toroidal core transformer having a second core and a second primary winding and a second secondary winding each wound around the second core, the second core being twisted 180 degrees relative to the first core along an axis in plane of the second core, the first and second primary windings being connected in parallel with one another, the first and second secondary windings being connected in parallel with one another, a first half of the first secondary winding being connected in series with a second half of the second secondary winding, and a second half of the first secondary winding being connected in series with a first half of the second secondary winding.

2. The transformer assembly of claim 1 wherein the first and second cores are made of a ferro-magnetic material.

3. The transformer assembly of claim 1 wherein the first and second toroidal core transformers are substantially identical.

4. The transformer assembly of claim 1 wherein the first and second transformers are anti-symmetrically wound relative to one another.

5. An antenna sub-system comprising:
   an antenna;
   first and second balanced signal contacts; and
   a transformer assembly connected between the antenna and the first and second balanced signal contacts, the transformer assembly including first and second transformer cores independently positionable in space relative to one another, a pair of primary windings connected to the antenna in parallel with one another, a pair of balanced secondary windings connected in parallel with one another between the first and second balanced signal contacts, a first transformer having the first transformer core, a first primary winding of the pair of primary windings, and a first secondary winding of the pair of secondary windings, and a second transformer having the second transformer core, a second primary winding of the pair of primary windings, and a second secondary winding of the pair of secondary windings,
   a first half of the first secondary winding connected in series with a second half of the second secondary winding between the first and second signal contacts, and a second half of the first secondary winding connected in series with a first half of the second secondary winding between the first and second signal contacts.

6. The antenna sub-system of claim 5 wherein the transformer assembly includes:
   the first primary winding and the first secondary winding being wound around the first transformer core; and
   the second primary winding and the second secondary winding being wound around the second transformer core.

7. The antenna sub-system of claim 6 wherein the first and second transformers are toroidal core transformers.

8. The antenna sub-system of claim 6 wherein the first and second transformers are substantially identical.

9. The antenna sub-system of claim 7 wherein the second transformer core is twisted 180 degrees relative to the first transformer core along an axis in plane of the second transformer core.

10. The antenna sub-system of claim 7 wherein each of the first transformer core and the second transformer core is made of a ferro-magnetic material.

11. An antenna sub-system comprising:
    an antenna;
    first and second balanced signal contacts; and
    a transformer assembly connected between the antenna and the first and second balanced signal contacts, the transformer assembly including first and second substantially identical and anti-symmetrically wound transformers connected in parallel between the antenna and the first and second balanced signal contacts,
    the first transformer including a first primary winding connected to the antenna and a first secondary winding connected between the first and second signal contacts, the second transformer including a second primary winding connected to the antenna and a second secondary winding connected between the first and second signal contacts, a first half of the first secondary winding connected in series with a second half of the second secondary winding between the first and second signal contacts, and a second half of the first secondary winding connected in series with a first half of the second secondary winding between the first and second signal contacts.

12. The antenna sub-system of claim 11 wherein the second primary winding is connected to the antenna in parallel with the first primary winding and the second secondary winding is connected in parallel with the first secondary winding between the first and second signal contacts.

13. The antenna sub-system of claim 11 wherein the first and second transformers are toroidal core transformers.

\* \* \* \* \*